United States Patent
Fukuzawa et al.

(10) Patent No.: US 6,664,183 B2
(45) Date of Patent: Dec. 16, 2003

(54) SHADOW MASK A METHOD OF FORMING THE SHADOW MASK, AND A METHOD OF MANUFACTURING A SEMICONDUCTOR DEVICE WITH USING THE SHADOW MASK

(75) Inventors: Shinichi Fukuzawa, Tokyo (JP); Shigeyoshi Ootsuki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/141,129

(22) Filed: May 8, 2002

(65) Prior Publication Data

US 2002/0125824 A1 Sep. 12, 2002

Related U.S. Application Data

(62) Division of application No. 09/422,191, filed on Oct. 21, 1999.

(30) Foreign Application Priority Data

Oct. 23, 1998 (JP) .......................................... 10-301844

(51) Int. Cl.$^7$ ......................................... H01L 21/4763
(52) U.S. Cl. ......................................... 438/640; 438/70
(58) Field of Search .............................. 438/70, 71, 73, 438/662, 640, 665, 673, 72, 666

(56) References Cited

U.S. PATENT DOCUMENTS

| | | | |
|---|---|---|---|
| 5,810,199 A | 9/1998 | Charlton et al. | |
| 5,850,042 A | 12/1998 | Warren | |
| 5,969,393 A | 10/1999 | Noguchi | |
| 6,127,255 A | 10/2000 | Sugiura et al. | |
| 6,297,071 B1 | * | 10/2001 | Wake |

FOREIGN PATENT DOCUMENTS

| JP | 56-6022 | 6/1954 |
|---|---|---|
| JP | 53-75858 | 7/1978 |
| JP | 62-297457 | 12/1987 |
| JP | 64-45160 | 3/1989 |
| JP | 3-250583 | 11/1991 |
| JP | 4-236758 | 8/1992 |
| JP | 8-227276 | 9/1996 |
| JP | 10-73913 | 3/1998 |
| JP | 10-298738 | 11/1998 |

\* cited by examiner

Primary Examiner—Phuc T. Dang
(74) Attorney, Agent, or Firm—Katten Muchin Zavis Rosenman

(57) ABSTRACT

A shadow mask is applicable to forming a minute film on a substrate by evaporation or the like. The shadow mask comprises a support film, a stopper film, a polyimide film and a thin plate.

The support film has enough mechanical strength necessary for forming predetermined sized holes. The stopper film is formed on the support film and is used as an etching stopper while forming the holes in the support film. The polyimide film is formed on the stopper film and bonds the stopper film to the thin plate. The thin plate is formed on the polyimide film and is made of a material which is the same as that of the substrate on which the film is formed or a material whose thermal expansion rate is substantially the same as that of the substrate.

Openings of the shadow mask are formed at predetermined regions through the support film, the stopper film, the polyimide film and the thin plate. Each of the openings has a tapered portion and a projected portion. The tapered portion is formed through the support film, the stopper film, the polyimide film and a part of the thin plate, and is broadened to the support film. The projected portion is a part of the thin plate projecting toward the center of the tapered portion.

During the step of forming a film on the substrate, the shadow mask is arranged so that the thin plate faces the substrate.

6 Claims, 13 Drawing Sheets

SHADOW MASK A METHOD OF FORMING THE SHADOW MASK, AND A METHOD OF MANUFACTURING A SEMICONDUCTOR DEVICE WITH USING THE SHADOW MASK

CROSS-REFERENCE TO RELATED APPLICATIONS

This application is a Divisional Application of application Ser. No. 09/422,191, filed on Oct. 21, 1999. A Continuation Application of application Ser. No. 09/422,191, application Ser. No. 10/142,416, was filed on May 9, 2002.

BACKGROUND OF THE INVENTION

1. Field of the Invention

The present invention relates to a shadow mask which is applicable to forming a film having predetermined patterns. The present invention also relates to a method of forming the shadow mask. The present invention further relates to a method of manufacturing a semiconductor device with using the shadow mask.

2. Description of the Related Art

An organic EL (Electroluminescence) display, which is one of semiconductor devices, has been employed in a television, a computer, and the like.

In order to realize color display, a plurality of light emission layers are selectively formed in predetermined areas in the organic EL display device. Each of the light emission layers emits light of red, green or blue. The formation of the light emission layers requires a metal sheet having apertures as a mask (shadow mask). The light emission layers are formed by evaporation.

For example, techniques disclosed in Unexamined Japanese Patent Application KOKAI Publications Nos. H3-250583 and H8-227276 relate to a method of manufacturing the organic EL display device.

FIG. 7 is a cross sectional view showing a state of forming the light emission layers with using a shadow mask described above.

A transparent anode 502 is formed on a transparent glass substrate 501, and a hole transfer layer 503 is formed on the anode 502. As shown in FIG. 7, a shadow mask 504 is arranged so as to be slightly distant from the hole transfer layer 503. An evaporation material 505 is placed so as to face the hole transfer layer 503 so that the shadow mask 504 intervenes between them.

The evaporation material 505 is heated, thus, light emission layers 506 are formed on predetermined regions of the hole transfer layer 503. Thereafter, an electron transfer layer and a cathode (not shown) are formed on the hole transfer layer 503 and the light emission layers 506, thus, the organic EL display device is completed.

In such the case using the shadow mask, a thinner shadow mask with finer apertures is required to form finer light emission layers. However, thinner the shadow mask becomes, harder to realize the fine apertures, because the shadow mask is made of the metal sheet. The thin shadow mask may be bent by heat for evaporation. Accordingly, it is difficult to form the light emission layers with precise dimensions.

Moreover, the light emission layers or the like may be broken when the shadow mask contact it, because of the shadow mask is made of metal. In such a case, yield of the organic EL display device may be deteriorated.

Unexamined Japanese Patent Application KOKAI Publications Nos. S53-75858, S62-297457 and H4-236758, and Unexamined Japanese Utility Model Application KOKAI Publication No. S64-45160 disclose masks for solving the above problems.

Unexamined Japanese Patent Application KOKAI Publication No. S53-75858 discloses a mask (evaporation mask) which comprises a thin silicon plate including boron and a support plate for reinforcing the silicon plate so as to have enough mechanical strength. Those thin silicon plate and support plate are formed unitarily. The thin silicon plate has a first hole whose side wall is perpendicular to a major surface of the thin silicon plate. The support plate have a second hole whose side wall is perpendicular to a major surface of the support plate. The second hole is larger than the first hole. In a case of forming a film on a substrate by evaporation, the mask is arranged so that its thin silicon plate faces the substrate.

In the case of forming the film on the substrate by the evaporation, some of evaporated particles slant toward the substrate. Since the side wall of the hole in the mask is perpendicular to the major surface of the mask-(or the substrate) as described above, edge of the hole in the mask prevents the evaporated particles slanting toward the substrate from reaching the substrate. As a result, the formed film does not always have correct dimensions.

The mask and the substrate may be expanded by temperature variation or the like during the film formation. If the material of the substrate differs from that of the thin silicon plate of the mask, the thermal expansion rate of the substrate also differs from that of the thin silicon plate. In a case where, for example, the thin silicon plate includes boron as described above, such the problem may occur when the material of the substrate is not silicon including boron. As a result, the dimensions of the formed film may differ from the planned value. Especially in the semiconductor device whose pattern is very fine, minute difference may cause short circuit or the like, and yield of the semiconductor device may be deteriorated.

Unexamined Japanese Patent Application KOKAI Publication No. S62-297457 discloses a mask (mask for evaporation) has the thickness of 50 to 400 micrometers and a hole whose side wall is perpendicular to a major surface of the mask.

Such the mask is too thick to manufacture an organic EL color display device or the like. Since the side wall of the hole in the mask is perpendicular to the major surface of the mask, the mask prevents the evaporated particles slanting toward the substrate from reaching the substrate. Accordingly, a film having inappropriate dimensions may be formed.

Moreover, it is difficult to precisely form fine apertures necessary for forming a film having fine patterns even if anisotropic etching is carried out to form the apertures.

Unexamined Japanese Utility Model Application KOKAI Publication No. S64-45160 discloses a mask (mask for forming a film) which comprises stacked first and second masks. The first mask, which is relatively thin, has an opening whose shape is the same as that of a film to be formed, and the second mask, which is relatively thick, has an opening which is larger than the opening in the first mask. Since those first and second masks are stacked with each other, they are formed separately. Therefore, the first mask may slide away from the second mask and vice versa, or the thinner first mask may be bent because of thermal expansion caused by temperature variation or the like during the film formation.

Moreover, it is difficult to form a hole (an opening) in a very thin film because such a film does not have enough strength. Therefore, the film must have appropriate thickness (for example, 100 micrometers). Therefore, the first mask is made so as to be thinner than the second mask, however, the first mask is not very thin (approximately 10 micrometers, for example). As a result, edge of the hole in the mask prevents the evaporated particulars slanting toward the substrate from reaching the substrate, thus, it is difficult to form a film having appropriate dimensions.

Unexamined Japanese Patent Application KOKAI Publication No. H4-236758 discloses a mask (mask for evaporation) which is made of a (100) surface single crystal silicon wafer. Firstly, a region including an area which will mask apertures are applied (to-be-aperture area) of the (100) surface single crystal silicon wafer is processed so as to be thinner than surrounding regions. Then an $SiO_2$ film is formed on regions other than the to-be-aperture area. Then apertures each of whose side wall is a (111) surface are formed by anisotropic etching the to-be-aperture area which is not covered with the $SO_2$.

Since there is an interrelation between the dimension of the aperture whose side wall is the (111) surface and the thickness of the mask, the above described mask is not suitable for forming a film having fine patterns.

Moreover, since the region including the to-be-aperture area is thinned first and then the apertures are formed as described above, the etching process is required twice. However, it is difficult to complete the first etching so that the single crystal silicon wafer has a predetermined thickness without failure, therefore, the to-be-aperture area may be too thin or too thick. As a result, the strength of the mask may decrease or apertures having appropriate dimensions are hardly to be formed.

Accordingly, if the masks disclosed in Unexamined Japanese Patent Application KOKAI Publications Nos. S53-75858, S62-297457 and H4-236758, and unexamined Japanese Utility Model Application KOKAI Publication No. S64-45160 are applied to manufacturing the organic EL display device, it is difficult to form the light emission layers each having appropriate dimensions. This causes deterioration of yield of the organic EL display device (semiconductor device).

SUMMARY OF THE INVENTION

It is an object of the present invention to provide a shadow mask by which a film having patterns of precise dimension is available. It is another object of the present invention to provide a method of forming a thin and strong shadow mask. It is a further object of the present invention to provide a method of manufacturing a semiconductor device with using the shadow mask by which a semiconductor device having excellent yield.

To accomplish the above objects, a shadow mask according to a first aspect of the present invention comprises:
  a support layer;
  a stopper layer, whose etching rate differs from etching rate of the support layer, formed on the support layer; and
  a surface layer formed on the stopper layer,
  wherein the support layer, the stopper layer and the surface layer comprise an opening having:
    a tapered portion which is formed through the support layer, the stopper layer and the surface layer and is broadened toward the support layer from the surface layer; and
    a projected portion which is a part of the surface layer projecting toward the center of the tapered portion.

According to this invention, the stopper layer is formed between the support layer and the surface layer. This structure allows that the support layer and the surface layer are processed separately while forming the opening by etching. Therefore, processing of the surface layer with excellent accuracy can be realized by etching.

A side of the projected portion may be broadened toward the support layer from the surface layer.

The stopper layer may be a part of the support layer, and the stopper layer and the surface layer may be bonded together.

A method of forming a shadow mask according to a second aspect of the present invention comprises:
  preparing a support layer having enough mechanical strength necessary for forming a predetermined hole therein;
  forming on the support layer a stopper layer to be an etching stopper while forming the hole in the support layer;
  forming a surface layer on the stopper layer;
  etching a predetermined area of the support layer until the stopper layer is exposed to form the hole;
  removing the stopper layer exposed through bottom of the hole;
  etching the surface layer exposed through the bottom of the hole so as to have a predetermined thickness to form a tapered portion which is broadened toward the support layer from the surface layer; and
  forming at the bottom of the hole a through hole whose diameter is smaller than that of the bottom of the hole to form an opening which comprises the tapered portion and a projected portion which is a part of the surface layer projecting toward the center of the tapered portion.

The support layer and the surface layer may be made of silicon; the stopper layer may be made of silicon dioxide; the etching the support layer may comprise etching of the support layer with a mixture gas of $Cl_2$ and $O_2$; the removing the stopper layer may comprise etching of the stopper layer with a $Cl_2$ gas; and the etching the surface layer may comprise etching of the surface layer with a mixture gas of $Cl_2$ and $O_2$.

The etching the support layer, the removing the stopper layer and the forming the tapered portion may comprise selecting a layer to be etched by controlling the partial pressure of $O_2$ in the mixture gas including $Cl_2$ and $O_2$.

The forming the stopper layer may comprise forming the stopper layer by thermal oxidizing a surface of the support layer; and the forming the surface layer may comprise bonding the surface layer to the stopper layer.

The forming the surface layer may comprise bonding the surface layer to the stopper layer with polyimide.

The forming the through hole may comprise forming the through hole by irradiating a laser beam onto the bottom of the hole.

A method of manufacturing a semiconductor device according to a third aspect of the present invention comprises:
  preparing a substrate; and
  forming a film having patterns regulated by predetermined dimensions on the substrate,
  wherein the forming the film comprises forming the film with using a shadow mask which comprises:
    a support layer;
    a stopper layer, whose etching rate differs from etching rate of the support layer, formed on the support layer; and a surface layer formed on the support layer,
wherein the support layer, the stopper layer and the surface layer comprise an opening having:
a tapered portion which is formed through the support layer, the stopper layer and the surface layer and is broadened toward the support layer from the surface layer; and
a projected portion which is a part of the surface layer projecting toward the center of the tapered portion.

The surface layer may be made of a material which is the same as a material of the substrate or a material whose thermal expansion rate is substantially the same as thermal expansion rate of the substrate; and the forming the film may comprise arranging the shadow mask so that the surface layer faces the substrate.

BRIEF DESCRIPTION OF THE DRAWINGS

These objects and other objects and advantages of the present invention will become more apparent upon reading of the following detailed description and the accompanying drawings in which.

DETAILED DESCRIPTION OF THE PREFERRED EMBODIMENT

First Embodiment

A shadow mask according to a first embodiment of the present invention will now be described with reference to accompanying drawings. The shadow mask is applicable to forming a mask on a substrate (film formation), for example.

Figure 1A:
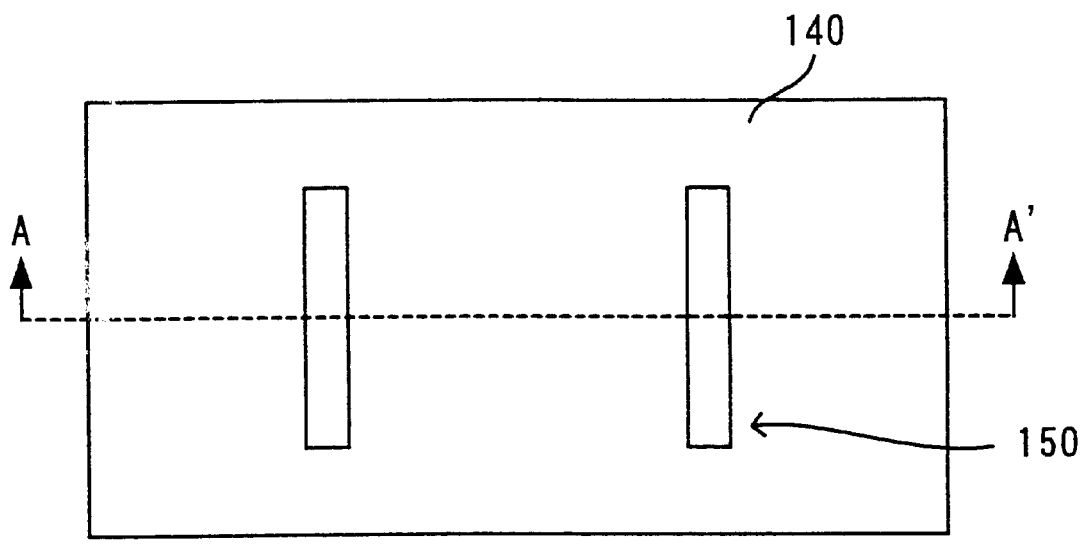
FIG. 1A is a plan view showing the structure of a shadow mask according to a first embodiment of the present invention.
Figure 1B:
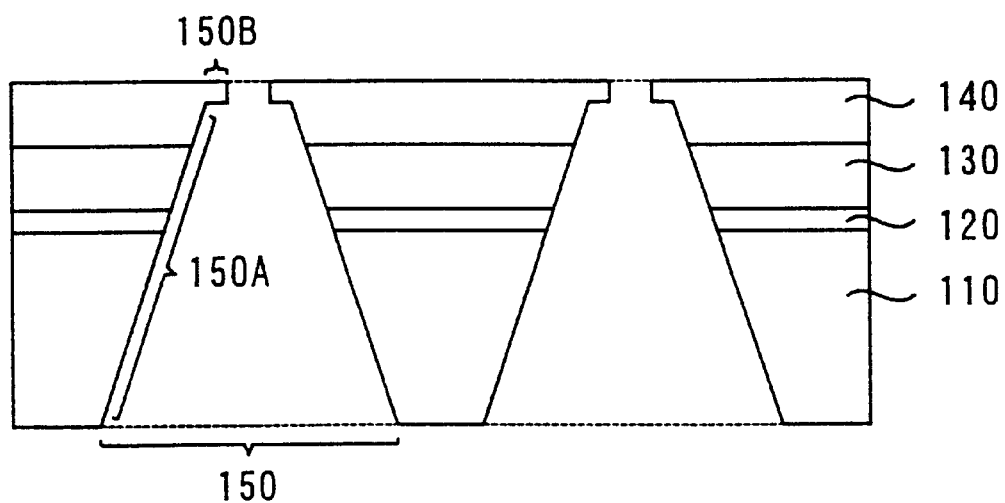
FIG. 1B is a cross sectional view along a line A–A' in FIG. 1A.

FIG. 1A is a plan view showing the structure of the shadow mask according to the first embodiment of the present invention, and FIG. 1B is a cross sectional view showing the shadow mask along a line A–A' shown in FIG. 1A.

As shown in FIGS. 1A and 1B, the shadow mask comprises a support film 110, a stopper film 120, a polyimide film 130, and a thin plate 140.

The support film 110 is approximately 480 micrometers thick and is prepared for increasing a mechanical strength of the shadow mask. In other words, the support film 110 prevents the shadow mask from being bent because of the temperature variation or the like during the film formation. In a case where the support film 110 consists of, for example, silicon or silicon compound including iron (0.6%) and aluminum (0.39%), the Moh's hardness of the support film 110 is in the range of 7.0 to 13.0.

The stopper film 120 is approximately 100 nm thick, and is formed on the support film 110. The stopper film 120 will act as an etching stopper film when the support film 110 is etched in order to form openings 150. For such the purpose, the stopper film 120 is made of, for example, silicon dioxide when the support film 110 is made of silicon.

The polyimide film 130 is approximately 1 micrometer thick, and is formed on the stopper film 120. The polyimide film 130 bonds the thin plate 140 and the stopper film 120 together.

The thin plate 140 has the thickness which is finely controllable by etching (10 to 30 micrometers, more precisely approximately 20 micrometers, for example) and is made of a material which is the same as that of a substrate on which a film will be formed, or a material whose thermal expansion rate is substantially the same as that of the substrate. For example, the thin plate 140 is made of silicon when the substrate is made of silicon. The linear expansion rate of silicon is in the range of $1.95 \times 10^{-6}$ to $4.8 \times 10^{-6}$/K.

The openings 150 are formed at predetermined areas of the support film 110, the stopper film 120, the polyimide film 130 and the thin plate 140.

As shown in FIG. 1B, each of the openings 150 includes an tapered portion 150A in the support film 110, the stopper film 120, the polyimide film 130 and a part of the thin plate 140. The tapered portion 150A is broadened to the support film 110 from the thin plate 140. Around an end of the opening 150 in the thin plate 140, a projected portion 150B which projects toward the center of the end of the opening 150 is formed. The projected portion 150B is the other part of the thin plate 140 and has a predetermined thickness (approximately 5 microns, for example).

The tapered portion 150A is broadened to the support film 110, in other words, diameters of the opening 150 corresponding to the tapered portion 150A are gradually enlarged from the thin plate 140 to the support film 110. Therefore, evaporated particles easily enter the openings 150 during the film formation by evaporation. Moreover, the number of the evaporated particles blocked by the projected portion 150B is small, because the projected portion 150B is thin. The shadow mask having the above described structure helps to form a film having the correct dimensions on a substrate.

A method of forming the shadow mask having the above described structure will now be described. In this example, the support film 110 and the thin plate 140 are made of silicon and the stopper film 120 is made of silicon dioxide. FIGS. 2A to 2G are cross sectional views showing steps of forming the shadow mask.

Figure 2:
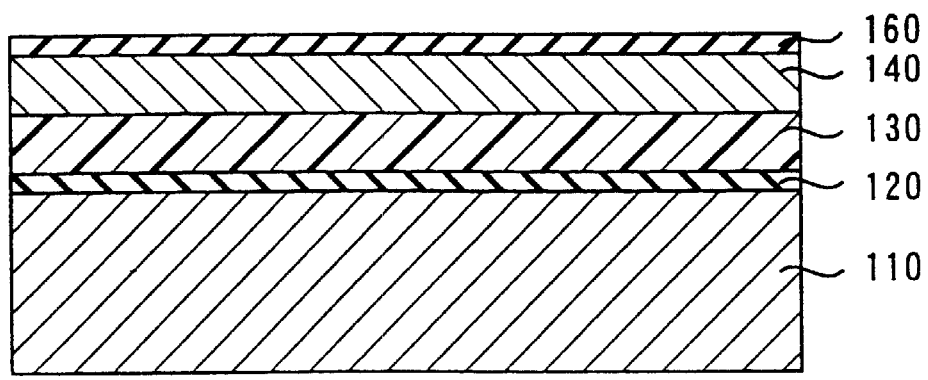
FIGS. 2A to 2G are cross sectional views showing steps of forming the shadow mask shown in FIGS. 1A and 1B.
Figure 2:
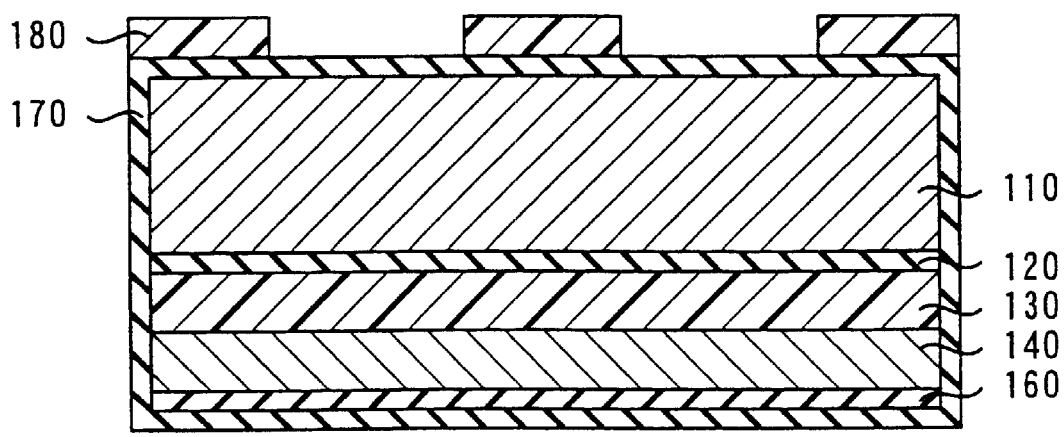
Figure 2:
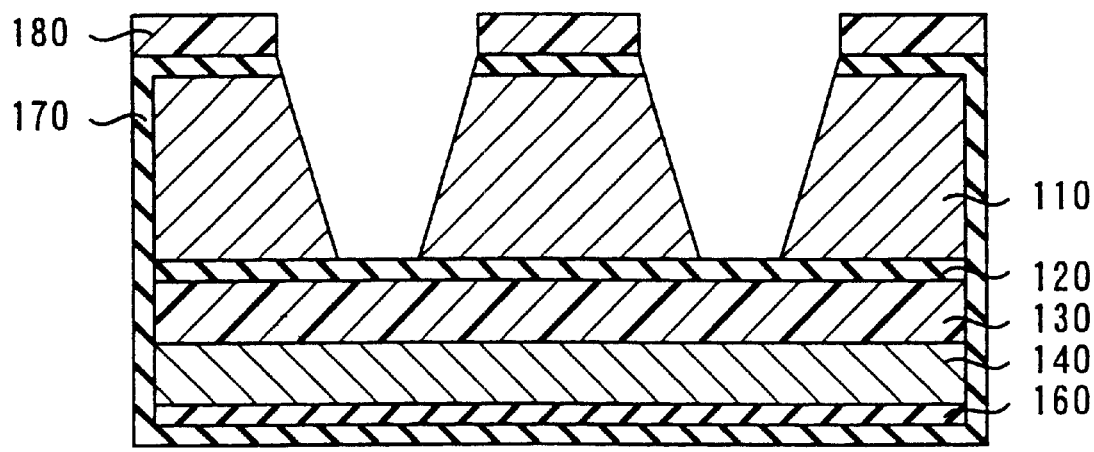
Figure 2:
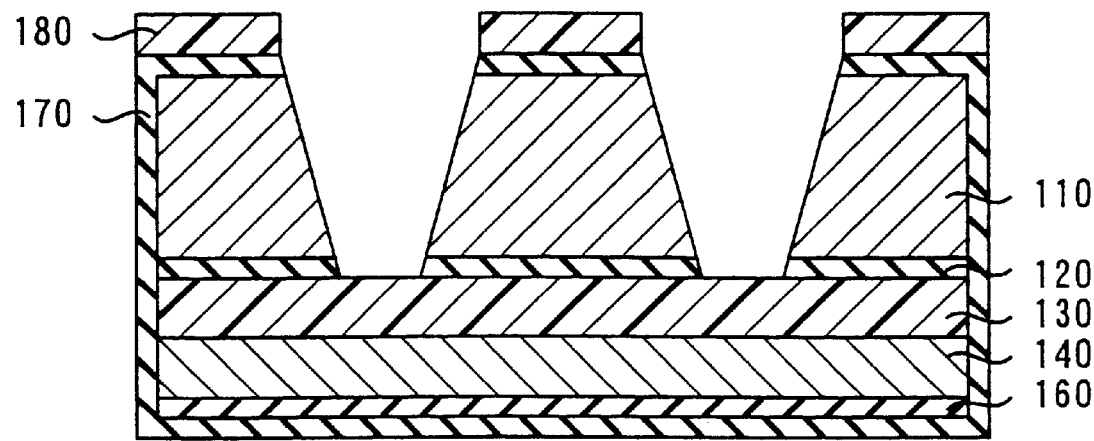
Figure 2:
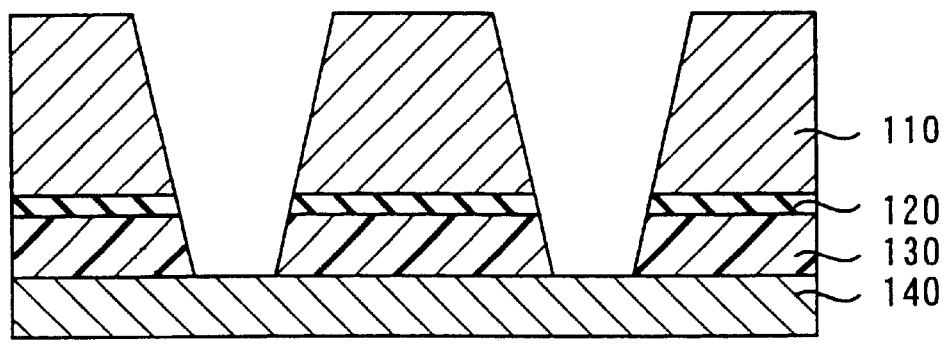
Figure 2:
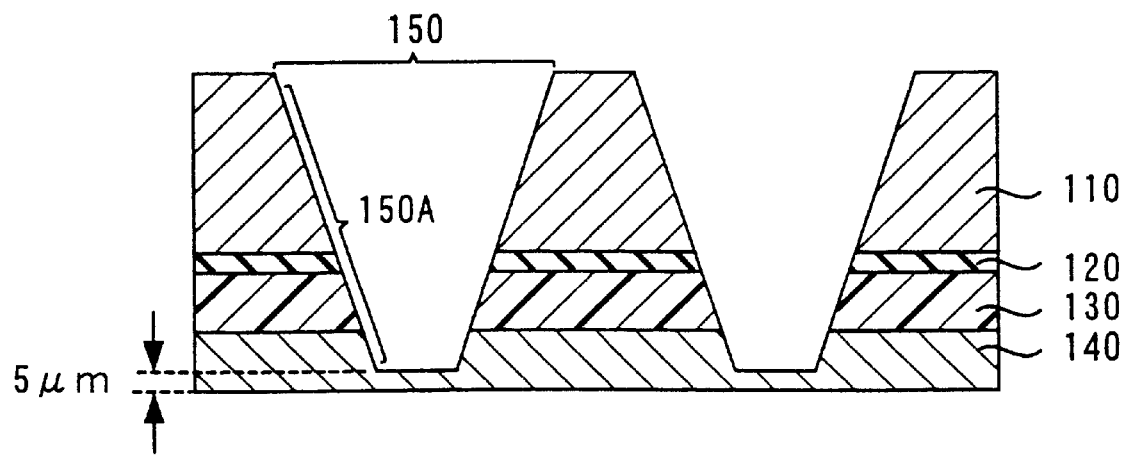

Firstly, the support film 110 is prepared. A thermal oxidized film which is approximately 100 nm thick is formed on the surface of the support film 110 by thermal oxidation. As shown in FIG. 2A, the thermal oxidized film is the stopper film 120.

Then, the polyimide film 130 is formed on the stopper film 120 by spin coating as shown in FIG. 2A.

And then, the thin plate 140 which is approximately 20 micrometers thick is placed on the polyimide film 130. The thin plate 140 is formed by polishing the single crystal silicon. The baking treatment with a temperature of approximately 300 degrees Celsius is carried out to bond the thin plate 140 and the stopper film 120 with the polyimide film 130. Thus, the support film 110, the stopper film 120, the polyimide film 130 and the thin plate 140 are connected unitarily.

A silicon dioxide film 160 which is approximately 100 nm thick is formed on the thin plate 140 by the room temperature CVD (Chemical Vapor Deposition) or the like, as shown in FIG. 2A.

As shown in FIG. 2B, a silicon nitride film 170 which is approximately 60 nm thick is formed by, for example, the CVD or the like so as to cover whole of the shadow mask shown in FIG. 2A.

A resist film 180 is formed by the CVD or the like on the silicon nitride film 170 in the support film 110 side. The resist film 180 is patterned by photolithography or the like as shown in FIG. 2B. More precisely, the resist film 180 is pattered so that portions corresponding to regions where the openings 150 will be formed are removed.

As shown in FIG. 2C, the silicon nitride film 170 and the support film 110 are etched by anisotropic etching with an alkaline etchant while using the patterned resist film 180 as an etching mask. More precisely, the silicon nitride film 170 and the support film 110 are etched so that diameters of the opening in the support film 110 formed by the etching are gradually enlarged from the bottom to the surface. During the etching, the stopper film 120 between the support film 110 and the thin plate 140 prevents the thin plate 140 from being etched. Therefore, of the elements in the shadow mask, only the support film 110 which reinforces the mechanical strength is etched in the first step.

And then, exposed portions of the stopper film 120 are etched as shown in FIG. 2D. During this etching, the support film 110 acts as an etching mask.

As shown in FIG. 2E, the resist film 180 and exposed portions of the polyimide film 130 are removed, and then the silicon nitride film 170 is removed by etching. Thereafter, the silicon dioxide film 160 is removed by etching with hydrogen fluoride buffer solution as shown in FIG. 2E.

Then the thin plate 140 is etched with etchant in which glacial acetic acid, nitric acid, and hydrofluoric acid are mixed so that the remained thin plate 140 just below the bottom of the opening has the thickness of approximately 5 micrometers. The support film 110, the stopper film 120 and the polyimide film 130 are also etched as well as the thin plate 140. Thus, the tapered portion 150A which broadened more widely to the support film 110 is formed.

As described above, the support film 110 and the thin plate 140 are etched separately, that is, not successively. And the etching of the thin plate 140 can be done within a short period of time because of its thinness. Therefore, there is substantially no unevenness in the etching degree. This fact is helpful to etch the thin plate 140 precisely so that the remained thin plate 140 just below the bottom of the opening has the predetermined thickness.

Figure 2G:
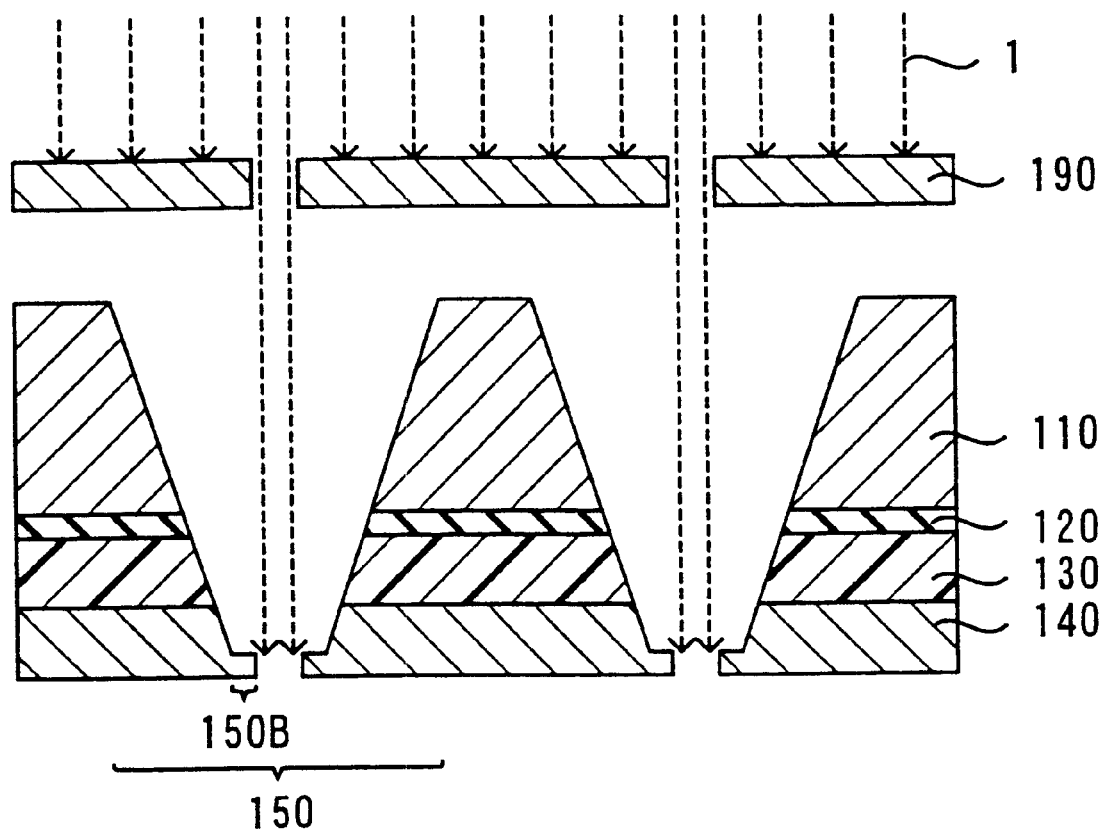

Then a mask 190 having apertures with regulated dimensions is arranged to face the support film 110 of the shadow mask, as shown in FIG. 2G. Laser beams 1 are irradiated onto the shadow mask through the mask 190. Thus, holes whose dimensions are substantially the same as those of a film to be formed on a substrate are formed in the thin plate 140. Excimer laser having the wavelength of 248 nm is used as the laser beam 1. According to such the laser beam 1, portions on the thin plate 140 onto which the laser beams 1 are irradiated are not melted but sublimated. The projected portion 150B which is formed after such the sublimation has a smooth surface. Thus, the shadow mask having the openings 150 shown in FIGS. 1A and 1B is completed.

Thus formed shadow mask is applicable to forming a film on a substrate by evaporation or the like. In this case, the shadow mask is arranged so that the thin plate 140 face the substrate. As described above, since the openings 150 have wider ends at the support film 110 side, the number of evaporated particles blocked by the shadow mask is small. Moreover, since the thin plate 140 near the substrate is made of the same material as that of the substrate, the resultant film has precise dimensions even if the temperature varies during the film formation.

Second Embodiment

A shadow mask according to a second embodiment will now be described with reference to the accompanying drawings.

The structure of the shadow mask in the second embodiment is substantially the same as that in the first embodiment, however, a method of forming the shadow mask in the second embodiment differs from that in the first embodiment. The method of forming the shadow mask according to the second embodiment will now be described.

The steps from preparing the support film 110 to patterning the resist film 180 formed on the silicon nitride film 170 near the support film 110 by photolithography or the like (refer to FIG. 2B) are substantially the same as the steps described in the first embodiment.

After the resist film 180 is patterned, the silicon nitride film 170 is etched by dry etching with a $CF_4$ gas or a $CHF_3$ gas while using the patterned resist film 180 as an etching mask.

Then the support film 110 is etched. During this etching, a mixture gas including $Cl_2$ and $O_2$ is used as an etching gas. Since setting the partial pressure of $O_2$ is higher than that of $Cl_2$ in the mixture gas brings isotropic etching, the partial pressure of the $O_2$ in the etching gas is adjusted so that the etched portion in the support film 110 has the tapered shape, that is, broadened to the resist film 180 from the stopper film 120. The stopper film 120 made of silicon dioxide is not etched by the $O_2$ gas. Therefore, the stopper film 120 is not etched by the above described mixture gas in which the partial pressure of $O_2$ is relatively high. Accordingly, the stopper film 120 between the support film 110 and the thin plate 140 prevents the thin plate 140 from being etched immediately after the support film 110 is etched.

After the support film 110 is etched, the partial pressure of $O_2$ in the mixture gas is adjusted so as to be decreased. Thus, the stopper film 120 is etched by the $Cl_2$ gas. The polyimide film 130 is etched by the $O_2$ gas, therefore, the polyimide film 130 is not etched substantially by the adjusted mixture gas in which the partial pressure of $O_2$ is relatively low.

After the stopper film 120 is etched, the partial pressure of $O_2$ in the mixture gas is adjusted so as to be increased. More precisely, the partial pressure is adjusted so that the mixture gas include the same amounts of $Cl_2$ and $O_2$. Thus, the polyimide film 130 is etched.

Then etching of the thin plate 140 follows, that is, the thin plate 140 made of silicon is also etched by the mixture gas. In other words, the polyimide film 130 and the thin plate 140 are etched like one film. In this case, the thin plate 140 is etched so that remained thin plate 140 just below the bottom of the opening has the thickness of approximately 5 micrometers. Since the mixture gas includes the almost same amounts of $Cl_2$ and $O_2$, the support film 110 and the stopper film 120 are also etched simultaneously while the polyimide film 130 and the thin plate 140 are etched. Thus, the tapered portion 150A which is broadened more widely to the support film 110 from the thin; plate 140 is formed.

As described above, the support film 110 and the thin plate 140 are etched in separated steps by controlling the partial pressure of $O_2$ in the mixture gas. The polyimide film 130 and the thin plate 140 are etched like one film is etched. Since both the polyimide film 130 and the thin plate 140 are thin, those are etched within a short period of time. According to this characteristics, there is substantially no unevenness in the etching degree. This fact is helpful to etch the thin plate 140 precisely so that the remained thin plate 140 just below the bottom of the opening has the predetermined thickness.

Thereafter, as the same manner described in the first embodiment, the mask 190 having apertures with regulated dimensions is arranged to face the support film 110 of the shadow mask, and the laser beams 1 are irradiated onto the shadow mask through the mask 190. Thus, smooth surfaced projected portion 150B is formed. As a result, the shadow mask according to the second embodiment having the openings 150 is completed.

As in the same manner described in the first embodiment, the formed shadow mask is applicable to forming a film on a substrate by evaporation or the like. In this case, the shadow mask is arranged so that the thin plate 140 face the substrate. As described above, since the openings 150 have wider ends in the support film 110 side, the shadow mask blocks few evaporated particles slanting toward the substrate. Moreover, since the thin plate 140 near the substrate is made of the same material as that of the substrate, the resultant film has precise dimensions even if the temperature varies during the film formation.

Third Embodiment

A method of manufacturing an organic EL (Electroluminescense) display according to a third embodiment will now be described.

The method of manufacturing the organic EL display includes usage of a shadow mask which is similar to that described in the first or second embodiment, as described later.

Figure 3A:
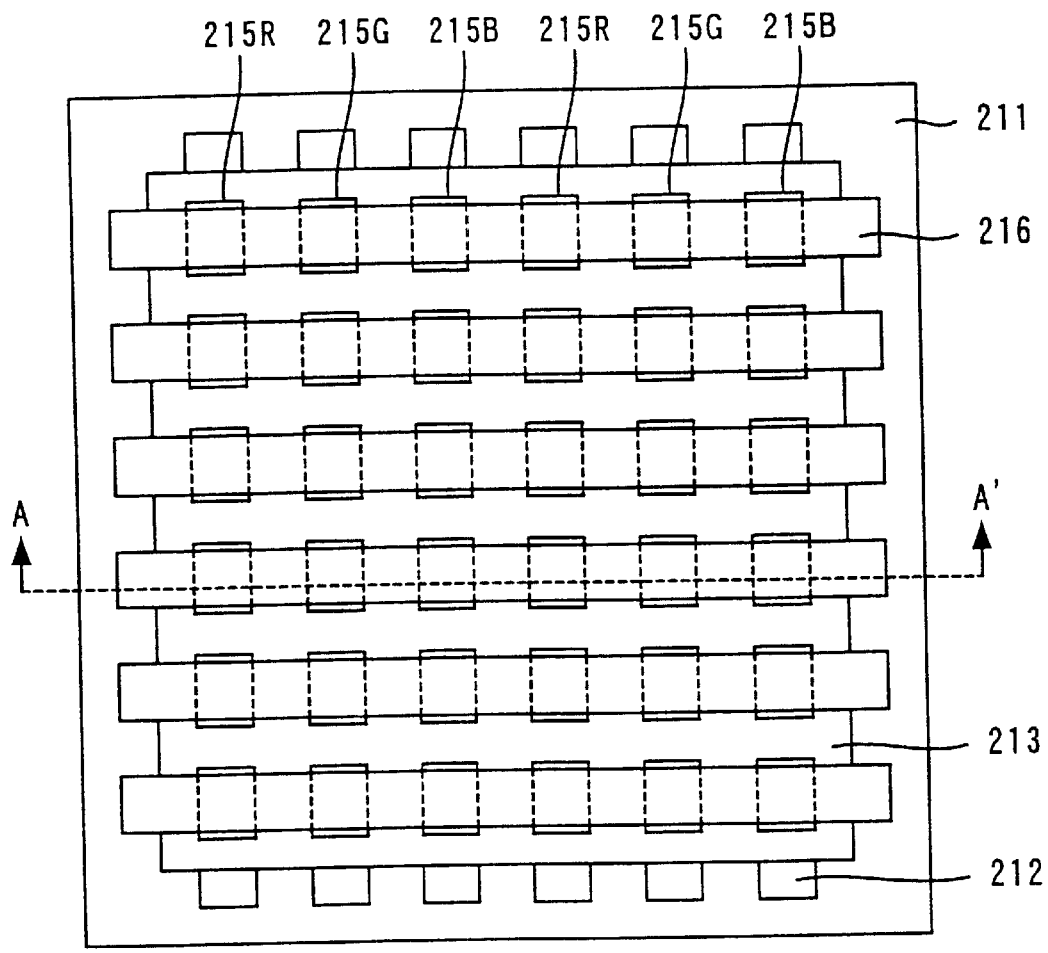
FIG. 3A is a plan view showing the structure of an organic EL display manufactured by a manufacturing method according to a third embodiment.
Figure 3B:
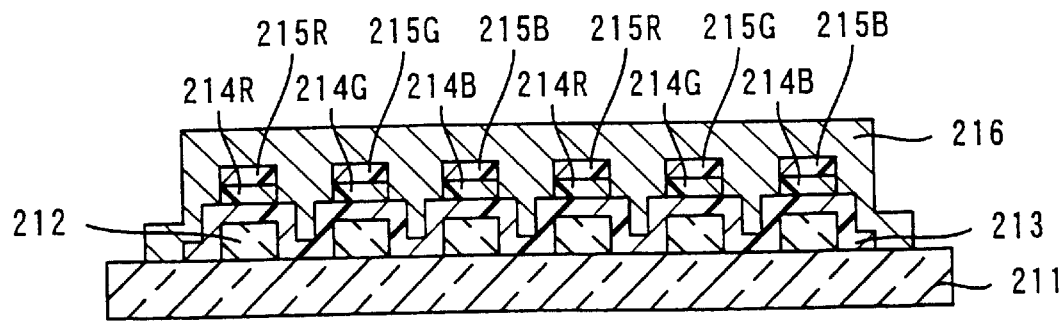
FIG. 3B is a cross sectional view along a line A–A' shown in FIG. 3A.

FIG. 3A is a plan view showing the structure of the organic EL display manufactured by the manufacturing method according to the third embodiment, and FIG. 3B is a cross sectional view showing the organic EL display shown in FIG. 3A along a line A–A'.

As shown in FIGS. 3A and 3B, the organic EL display comprises a substrate 211, anodes 212, a hole transfer layer 213, organic light emission layers 214R, 214G and 214B, electron transfer layers 215R, 215G and 215B, and cathodes 216.

The substrate 211 is transparent optically, and is made of, for example, glass or the like.

A plurality of the anodes 212 are formed on the substrate 211 so as to be arranged parallel to each other at predetermined intervals. The anodes 212 are transparent optically, and are made of, for example, ITO (Indium Tin Oxide) or the like. Each of the anodes 212 has the thickness of approximately 120 nm.

The hole transfer layer 213 is formed on the substrate 211 and the anodes 212 as shown in FIGS. 3A and 3B. The hole transfer layer 213 supplies holes to the organic light emission layers 214R, 214G and 214B when a predetermined voltage is applied to the hole transfer layer 213. The hole transfer layer 213 has the thickness of approximately 50 nm, and is made of, for example, N,N'diphenyl-N,N'-di(3-methylphenyl)-1,1'-biphenyl-4,4'-diamine, or the like.

A plurality of organic light emission layers 214R, 214G and 214B are formed on the hole transfer layer 213 at predetermined intervals so as to correspond to the anodes 212 respectively. In other words, the organic light emission layers 214R, 214G and 214B are arranged on the hole transfer layer 213 in matrix form. The organic light emission layers 214R, 214G and 214B are arranged in this order. Each of the organic light emission layers 214R, 214G and 214B has the thickness of approximately 25 nm.

The organic light emission layers 214R are made of, for example, alumiquinoline complex in which 4-dicyanomethylene-2-mehyl-6-(p-dimethylaminostyryl)-4H-pyrane (DCM) is doped or the like. Each of the organic light emission layers 214R emits red light when it receives holes supplied from the anode 212 side and electrons supplied from the cathode 216 side. The doping concentration of DCM is approximately 5 wt %.

The organic light emission layers 214G are made of, for example, tris (8-quinolinol) aluminum (aluminum complex) in which quinacridone is doped or the like. Each of the organic light emission layers 214G emits green light when it receives holes supplied from the anode 212 side and electrons supplied from the cathode 216 side. The doping concentration of quinacridone is approximately 5 wt %.

The organic light emission layers 214B are made of, for example, perylene, etc., and emit blue light when they receive holes supplied from the anode 212 side and electrons supplied from the cathode 216 side.

Each of the electron transfer layers 215R, 215G and 215B has the thickness of approximately 35 nm.

The electron transfer layers 215R are formed on the organic light emission layers 214R as shown in FIGS. 3A and 3B. When a predetermined voltage is applied to the electron transfer layer 215R, it supplies electrons to the organic light emission layer 214R. The electron transfer layers 215R are made of, for example, alumiquinoline complex or the like.

The electron transfer layers 215G are formed on the organic light emission layers 214G as shown in FIGS. 3A and 3B. When a predetermined voltage is applied to the electron transfer layer 215G, it supplies electrons to the organic light emission layer 214G. The electron transfer layers 215G are made of, for example, tris (8-quinolinol) aluminum or the like.

The electron transfer layers 215B are formed on the organic light emission layer 214B as shown in FIGS. 3A and 3B. When a predetermined voltage is applied to the electron transfer layer 215B, it supplies electrons to the organic light emission layer 214B. The electron transfer layers 215B are made of, for example, tris (8-quinolinol) aluminum or the like.

As shown in FIGS. 3A and 3B, the cathodes 216 are formed on the hole transfer layer 213 and the electron transfer layers 215R, 215G and 215B so as to substantially intersect with the anodes 212 at right angle. In other words, the cathodes 216 are formed so that the organic light emission layers 214R, 214G and 214B correspond to inter-sections between the cathodes 216 and the anodes 212 (pixels). Each of the cathodes 216 has the thickness of approximately 130 nm, and is made of aluminum and lithium.

A method of manufacturing the organic EL display having the above described structure will now be described.

FIGS. 4A to 4I are cross sectional views showing the steps of manufacturing the organic EL display.

Figure 4A:
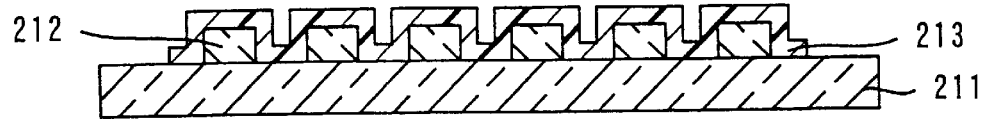
FIGS. 4A to 4I are cross sectional views showing steps of manufacturing the organic EL display shown in FIGS. 3A and 3B.

Firstly, the substrate 211 is prepared, and the anodes 212 are formed on the substrate 211 as shown in FIG. 4A by CVD (Chemical Vapor Deposition) and photolithography.

Then, the hole transfer layer 213 is formed on the glass substrate 211 and the anodes 212 as shown in FIG. 4A by vacuum evaporation.

Figure 4B:
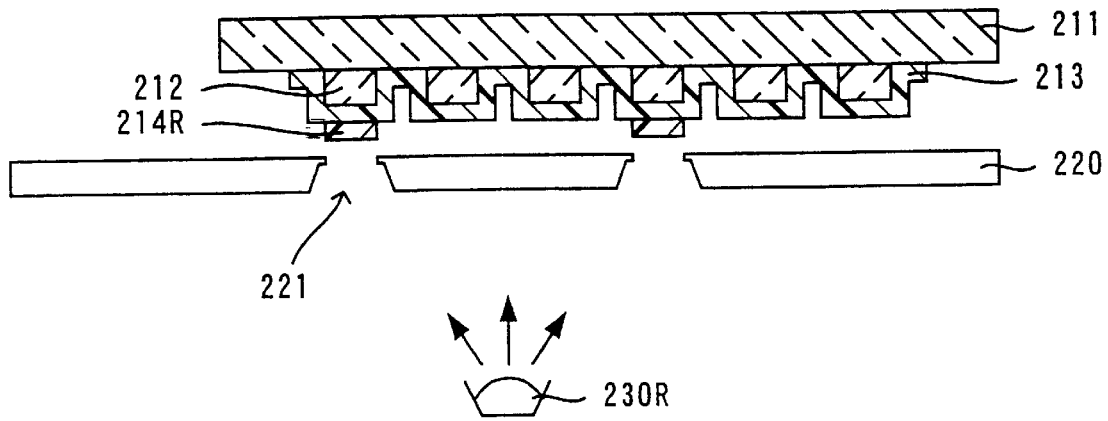
Figure 5A:
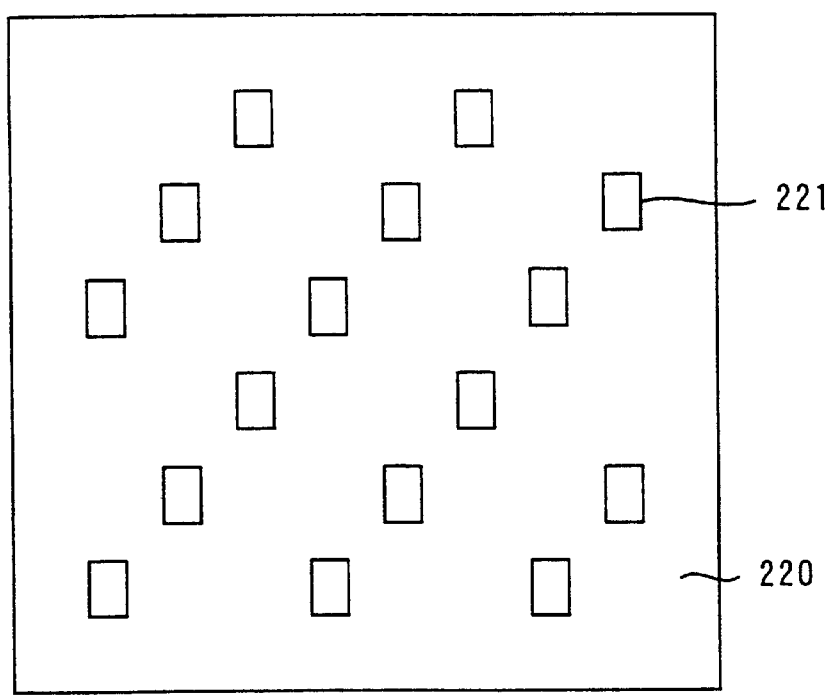
FIGS. 5A and 5B are plan views showing the structure of a shadow mask used in the third embodiment.

And then, a shadow mask 220 is disposed so as to face the hole transfer layer 213 as shown in FIG. 4B, and an illuminant material (red) 230R is placed so that evaporated illuminant particles go toward the hole transfer layer 213 through the shadow mask 220. The shadow mask 220 has openings 221 whose shape is the same as that of the openings 150 described in the first and second embodiments. The openings 221 are arranged in matrix form as shown in FIG. 5A, for example, so that the openings 221 correspond to pixels corresponding to regions on which the organic light emission layers 214R are formed. The illuminant material (red) 230R is made of, for example, alumiquinoline complex in which 4-dicyanomethylene-2-mehyl-6-(p-dimethylaminostyryl)-4H-pyrane (DCM) is doped or the like.

The illuminant material (red) 230R is evaporated by being heated. Then the organic light emission layers 214R are formed on the hole transfer layer 213 as shown in FIG. 4B.

Figure 4C:
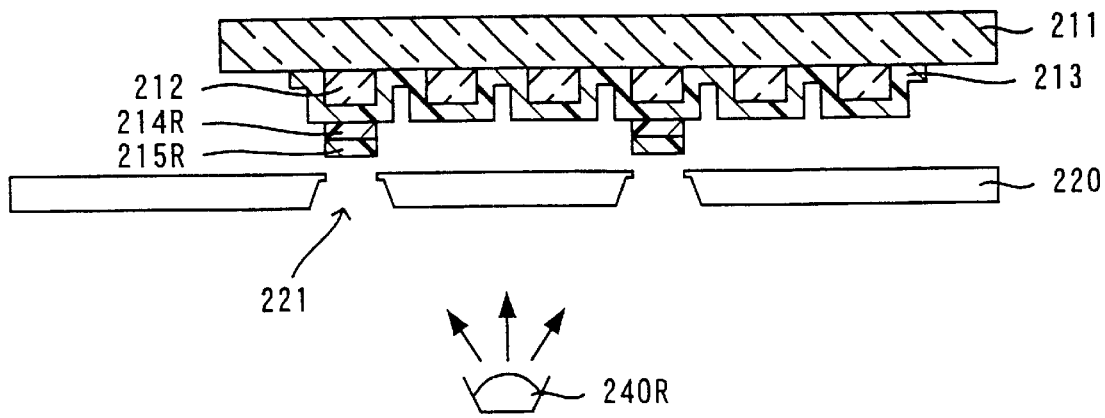
Figure 4:
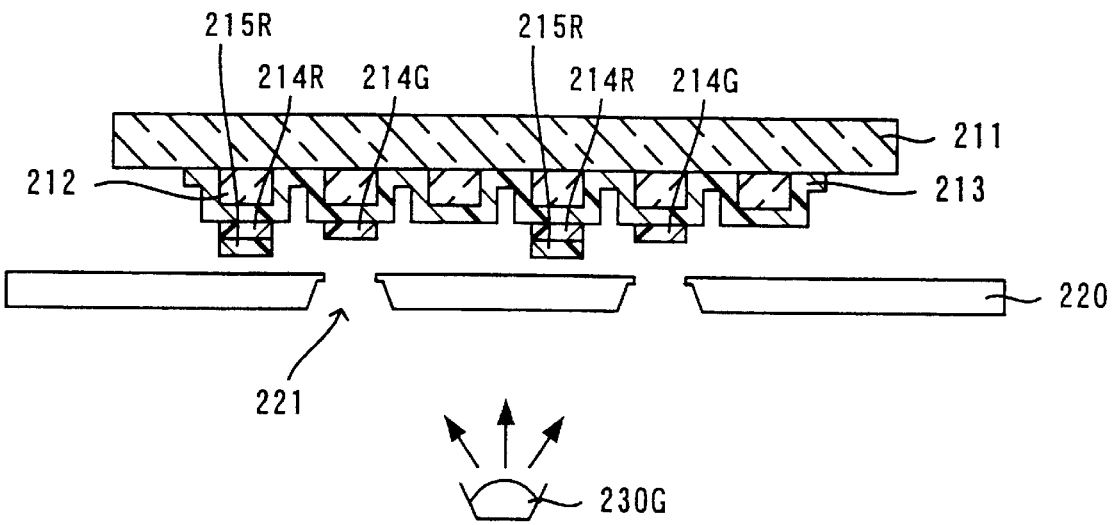
Figure 4:
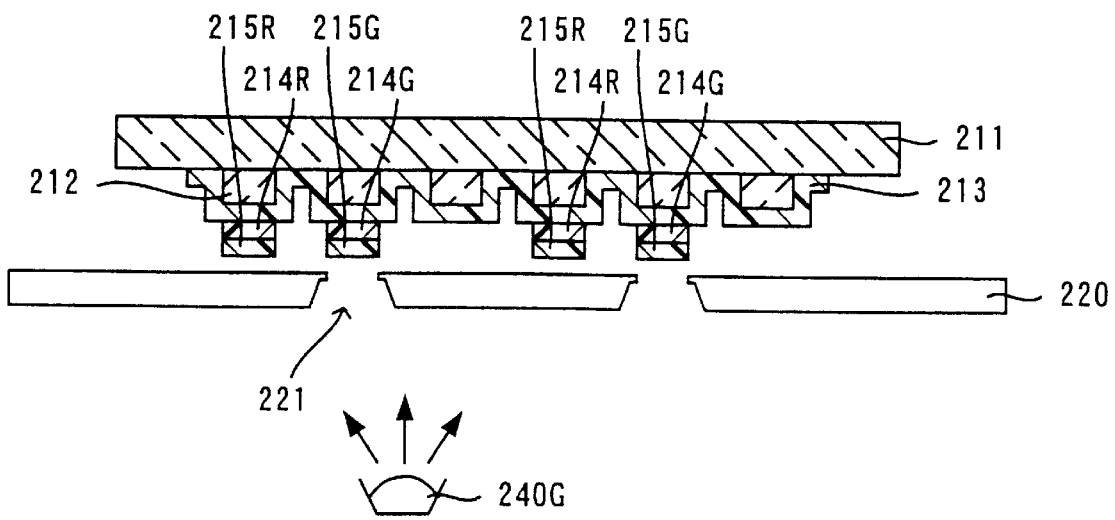
Figure 4:
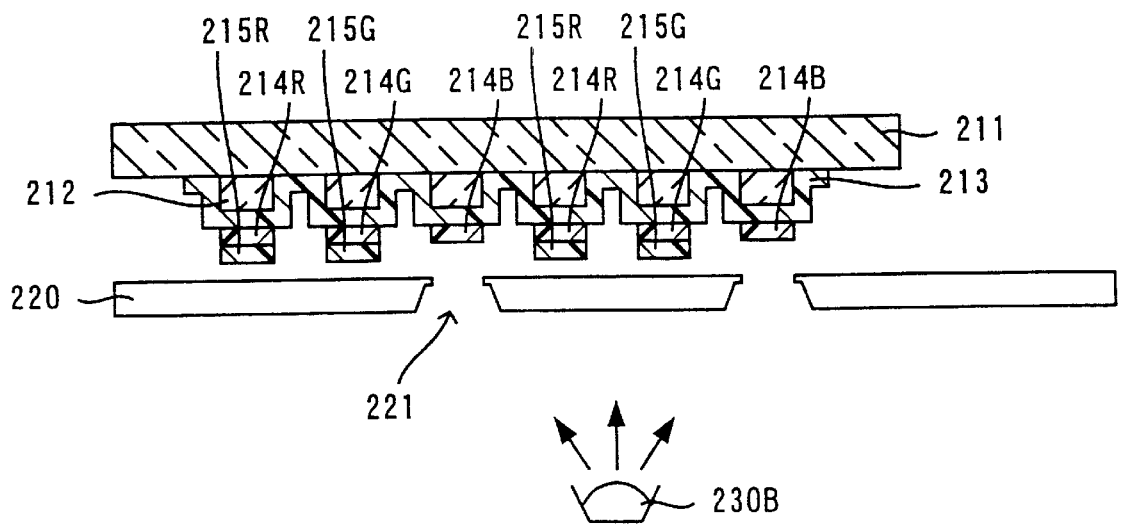
Figure 4:
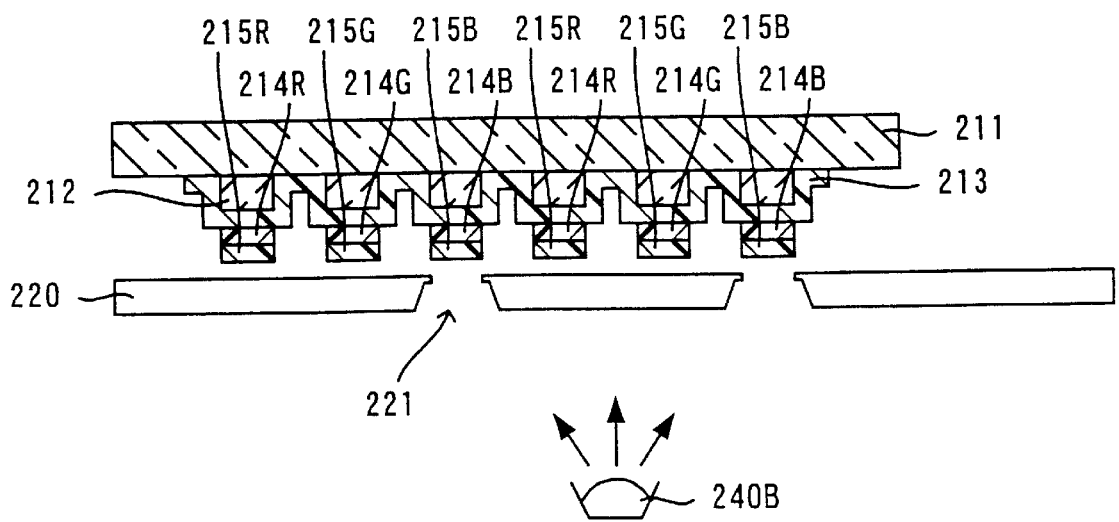
Figure 4:
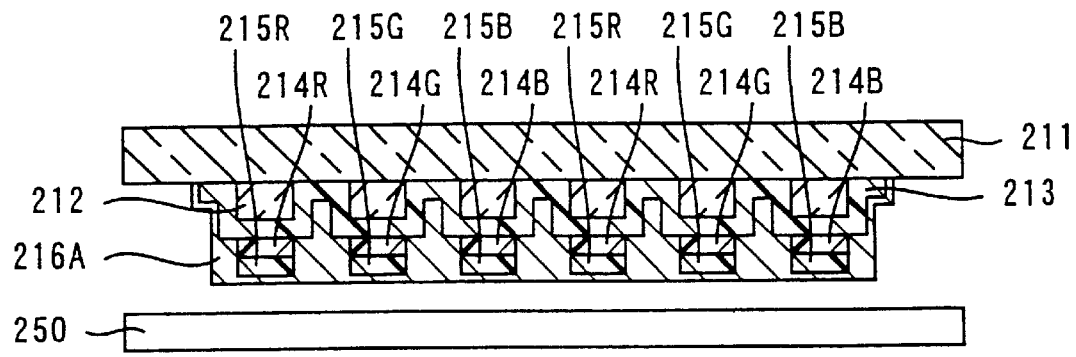
Figure 4:
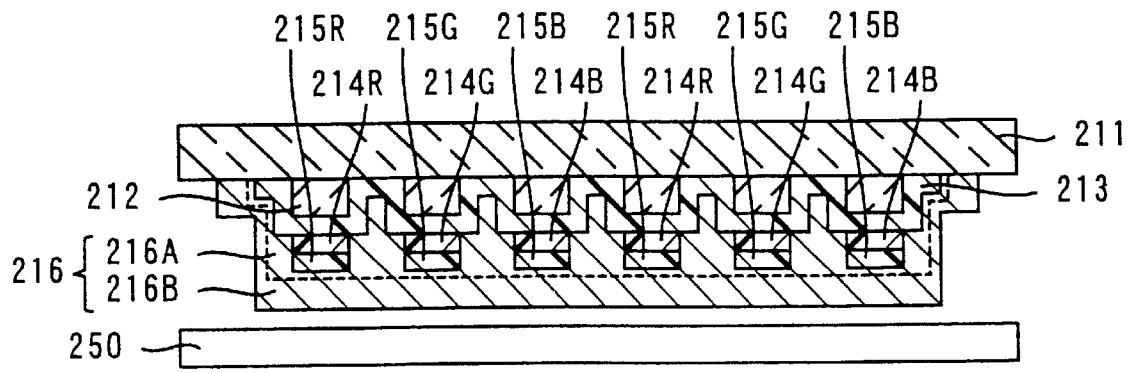

Then, an electron transfer layer material 240R is placed instead of the illuminant material (red) 230R as shown in FIG. 4C. The electron transfer layer material 240R is made of, for example, alumiquinoline complex or the like. And the vacuum evaporation is carried out to form the electron transfer layers 215R on the organic light emission layers 214R. Then the electron transfer layers 215R are formed on the organic light emission layers 214R as shown in FIG. 4C.

The shadow mask 220 is moved so that the openings 221 correspond to pixels adjacent to the pixels on which the organic light emission layers 214R are formed. And an illuminant material (green) 230G is placed so that evaporated illuminant particles go toward the hole transfer layer 213 through the shadow mask 220. The illuminant material (green) 230G is made of, for example, tris (8-quinolinol) aluminum (aluminum complex) in which quinacridone is doped or the like.

The illuminant material (green) 213G is evaporated by being heated. Then the organic light emission layers 214G are formed on the hole transfer layers 213 so as to correspond to the pixels adjacent to the organic light emission layers 214R as shown in FIG. 4D.

Then, an electron transfer layer material 240G is placed in stead of the illuminant material (green) 230G as shown in FIG. 4E. The electron transfer layer material 240G is made of, for example, tris (8-quinolinol) aluminum, etc. The vacuum evaporation is carried out to form the electron transfer layers 215G on the organic light emission layers 214G. Then the electron transfer layers 215G are formed on the organic emission layers 214G as shown in FIG. 4E.

The shadow mask 220 is again moved so that the openings 221 correspond to pixels adjacent to the pixels on which the organic light emission layers 214G are formed, as shown in FIG. 4F. An illuminant material (blue) 230B is placed so that evaporated illuminant particles go toward the hole transfer layer 213 through the shadow mask 220. The illuminant material (blue) 230B is made of, for example, perylene or the like.

The illuminant material (blue) 230B is evaporated by being heated. Then the organic light emission layers 214B are formed on the hole transfer layer 213 so as to correspond to the pixels adjacent to the organic light emission layers 214G as shown in FIG. 4F.

Then an electron transfer layer material 240B is placed in stead of the illuminant material (blue) 230B. The electron transfer layer material 240B is made of, for example, tris (8-quinolinol) aluminum, etc. The vacuum evaporation is carried out to form the electron transfer layers 215B on the organic light emission layers 214B. Then the electron transfer layers 215B are formed on the organic light emission layers 214B as shown in FIG. 4G.

Thus, an electroluminescence array whose pixels emit light of three colors individually is formed.

Figure 5B:
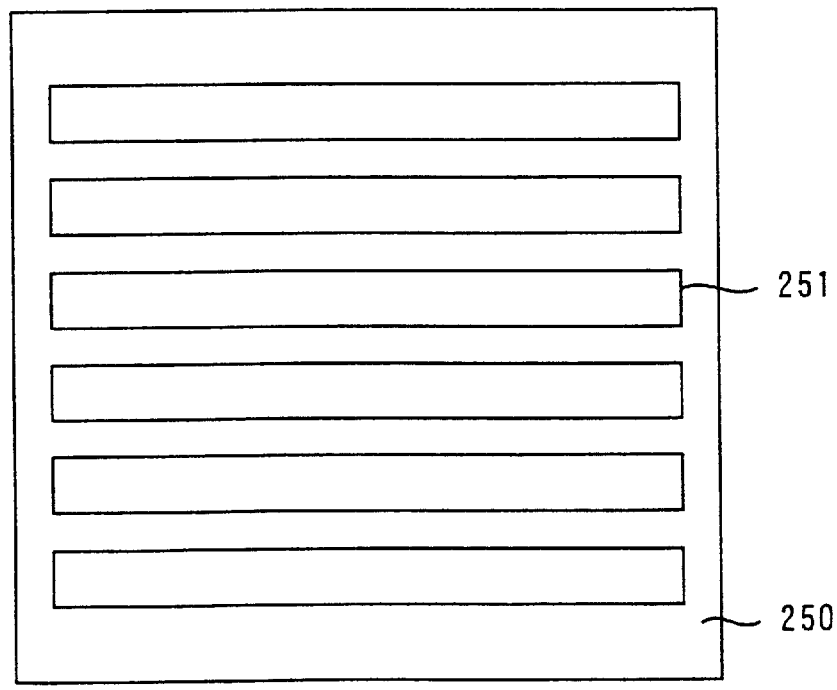

As shown in FIG. 4H, a shadow mask 250 is disposed so as to face the electron transfer layers 215R, 215G and 215B, and a conductor material 260 is placed so that evaporated conductor particles go toward the electron transfer layers 215R, 215G and 215B through the shadow mask 250. The shadow mask 250 has openings 251 similar to the openings 150 described in the first and second embodiments. The openings 251 of the shadow mask 250 are formed, for example, at predetermined intervals so as to intersect with the anodes 212 at right angle as shown in FIG. 5B. The conductor material 260 is made of, for example, aluminum and lithium.

The conductor material 260 is evaporated by being heated. Then a conductor film 216A having the thickness of approximately 3 nm is formed on the hole transfer layer 213 and the electron transfer layers 215R, 215G and 215B as shown in FIG. 4H.

Then, another conductor material 270 is placed in stead of the conductor material 260 as shown in FIG. 4I. The conductor material 270 is made of, for example, aluminum or the like. The conductor material 270 is evaporated by being heated. Then a conductor film 216B having the thickness of approximately 100 nm is formed on the conductor film 216A as shown in FIG. 4I by evaporation. The conductor films 216A and 216B act as the cathodes 216.

Thus, the organic EL display shown in FIGS. 3A and 3B is completed.

As described above, the shadow masks 220 and 250 applied to forming the organic light emission layers 214R, 214G and 214B and cathodes 216 has the openings similar to those in the shadow mask described in the first and second embodiments. That is, each of the shadow masks 220 and 250 has openings 221 and 251 respectively each of which has a tapered portion which is broadened to the material side from the substrate side, and a thin projected portion which projects toward the center of the openings. According to this structure, the shadow mask blocks few evaporated particles slanting toward the substrate's surface. Therefore, the formed organic light emission layers 214R, 214G and 214B, electron transfer layers 215R, 215G and 215B, and cathodes 216 have precise dimensions. As a result, the completed organic EL display is has excellent yield.

Figure 6:
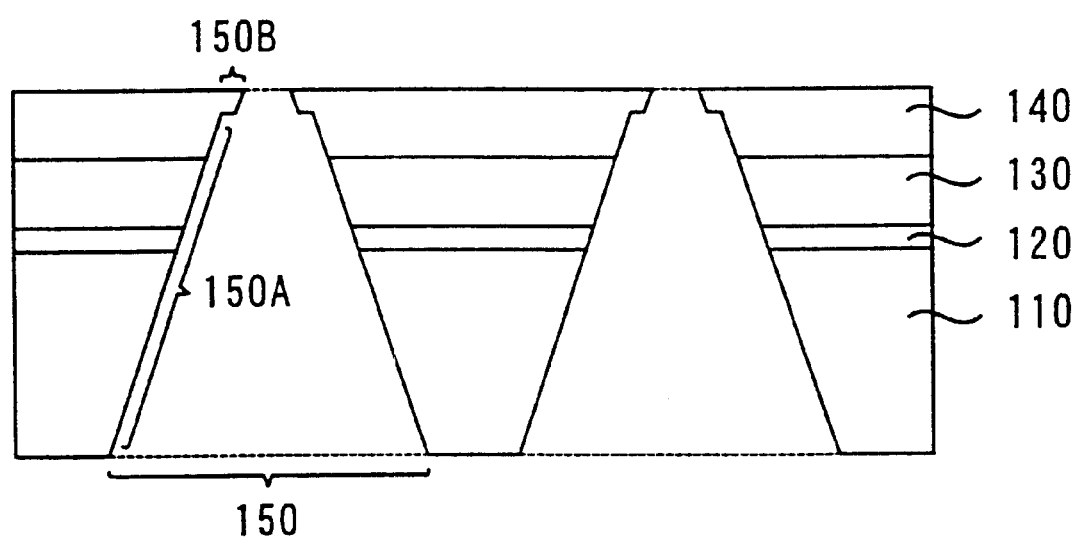
FIG. 6 is a cross sectional view showing another structure of the shadow mask according to the first and second embodiments.
Figure 7:
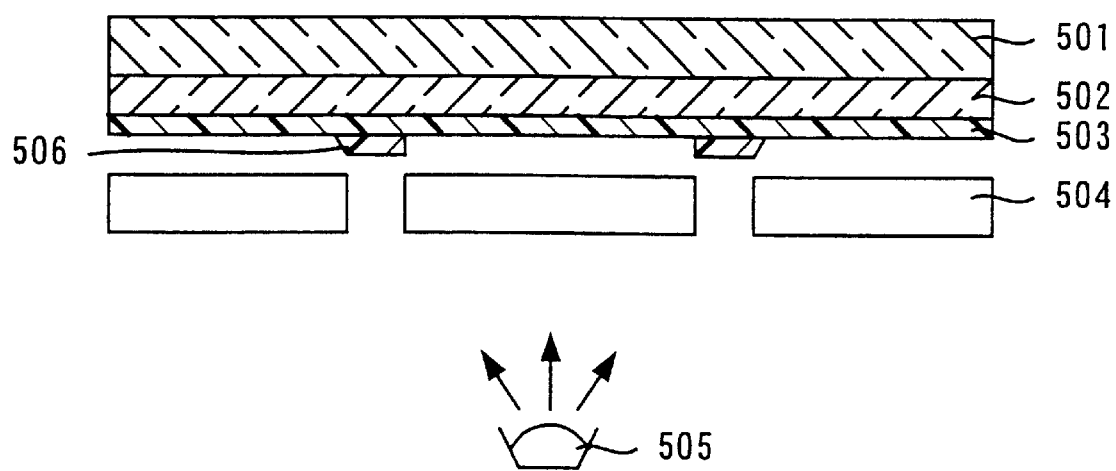
FIG. 7 is a cross sectional view showing a state of forming light emission layers in an organic EL display device with using a conventional shadow mask.

As shown in FIG. 6, the projected portion 150B may be formed so that the opening 150 corresponds to the projected portion 150B is broadened to the support film 110 from the thing plate 140 like the tapered portion 150A, that is the diameters of the opening 150 corresponding to the projected portion 150B is gradually enlarged toward the support film 110.

In the second embodiment, the partial pressure of $O_2$ in the mixture gas may be adjusted so that the mixture gas includes no $O_2$ for supplying only the $Cl_2$ gas while etching the stopper film 120.

The above described shadow masks may be used as masks for forming a film on a substrate by sputtering or the like.

The above described shadow masks may be applicable to not only the manufacture of the organic EL display but also manufacture of any semiconductor devices which require a film having minute patterns.

Various embodiments and changes may be made thereunto without departing from the broad spirit and scope of the invention. The above-described embodiments are intended to illustrate the present invention, not to limit the scope of the present invention. The scope of the present invention is shown by the attached claims rather than the embodiments. Various modifications made within the meaning of an equivalent of the claims of the invention and within the claims are to be regarded to be in the scope of the present invention.

This application is based on Japanese Patent Application No. H10-301844 filed on Oct. 23, 1998, and including specification, claims, drawings and summary. The disclosure of the above Japanese Patent Application is incorporated herein by reference in its entirety.

What is claimed is:

1. A method of forming a shadow mask comprising:

preparing a support layer having enough mechanical strength necessary for forming a predetermined hole therein;

forming on said support layer a stopper layer to be an etching stopper while forming said hole in said support layer;

forming a surface layer on said stopper layer;

etching a predetermined area of said support layer until said stopper layer is exposed to form said hole;

removing said stopper layer exposed through bottom of said hole;

etching said surface layer exposed through the bottom of said hole so as to have a predetermined thickness to form a tapered portion which is broadened toward said support layer from said surface layer; and forming at the bottom of said hole a through hole whose diameter is smaller than that of the bottom of said hole to form an opening which comprises said tapered portion and a projected portion which is a part of said surface layer projecting toward the center of said tapered portion.

2. The method of forming the shadow mask according to claim 1, wherein said support layer and said surface layer are made of silicon;

said stopper layer is made of silicon dioxide;

said etching said support layer comprises etching of said support layer with a mixture gas of $Cl_2$ and $O_2$;

said removing said stopper layer comprises etching of said stopper layer with a $Cl_2$ gas; and said etching said surface layer comprises etching of said surface layer with a mixture gas of $Cl_2$ and $O_2$.

3. The method of forming the shadow mask according to claim 2, wherein said etching said support layer, said removing said stopper layer and said forming said tapered portion comprise selecting a layer to be etched by controlling the partial pressure of $O_2$ in the mixture gas including $Cl_2$ and $O_2$.

4. The method of forming the shadow mask according to claim 3, wherein said forming said stopper layer comprises forming said stopper layer by thermal oxidizing a surface of said support layer; and said forming said surface layer comprises bonding said surface layer to said stopper layer.

5. The method of forming the shadow mask according to claim 4, wherein said forming said surface layer comprises bonding said surface layer to said stopper layer with polyimide.

6. The method of forming the shadow mask according to claim 5, wherein said forming said through hole comprises forming said through hole by irradiating a laser beam onto the bottom of said hole.

* * * * *